(12) United States Patent
Kostecka et al.

(10) Patent No.: US 9,974,200 B2
(45) Date of Patent: *May 15, 2018

(54) ADJUSTABLE SWINGING BRACKET

(71) Applicant: CommScope Technologies LLC, Hlickory, NC (US)

(72) Inventors: Ryan Kostecka, Waconia, MN (US); Steven J. Brandt, Savage, MN (US); John P. Anderson, Eden Prairie, MN (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/200,199

(22) Filed: Jul. 1, 2016

(65) Prior Publication Data

US 2017/0006722 A1    Jan. 5, 2017

Related U.S. Application Data

(63) Continuation of application No. 14/189,376, filed on Feb. 25, 2014, now Pat. No. 9,386,723.

(60) Provisional application No. 61/768,871, filed on Feb. 25, 2013.

(51) Int. Cl.
| | |
|---|---|
| G02B 6/00 | (2006.01) |
| H05K 5/02 | (2006.01) |
| H05K 7/18 | (2006.01) |
| F16L 3/06 | (2006.01) |
| F16L 3/14 | (2006.01) |
| H04Q 1/06 | (2006.01) |
| H04Q 1/02 | (2006.01) |

(52) U.S. Cl.
CPC .............. *H05K 5/0247* (2013.01); *F16L 3/06* (2013.01); *F16L 3/14* (2013.01); *H04Q 1/06* (2013.01); *H05K 5/0217* (2013.01); *H05K 7/186* (2013.01); *H04Q 1/02* (2013.01); *H04Q 1/066* (2013.01); *H04Q 1/131* (2013.01); *Y10T 29/49947* (2015.01)

(58) Field of Classification Search
CPC .. G02B 6/4471; H05K 7/1489; H05K 7/1487; H05K 7/16; H05K 7/1488; H05K 7/18; H05K 5/0247; H05K 7/186; H04Q 1/06; H04Q 1/08; H04Q 1/066; H04Q 1/068
USPC ........ 385/135–137; 361/679.02, 679.58, 810
See application file for complete search history.

(56) References Cited

U.S. PATENT DOCUMENTS

| | | |
|---|---|---|
| 9,386,723 B2 | 7/2016 | Kostecka et al. |
| 2004/0258384 A1 | 12/2004 | Trebesch et al. |
| 2006/0018622 A1 | 1/2006 | Caveney et al. |
| 2011/0039665 A1* | 2/2011 | Dibble ................. A63B 21/045 482/92 |

(Continued)

*Primary Examiner* — Kaveh C Kianni
*Assistant Examiner* — Hung Lam
(74) *Attorney, Agent, or Firm* — Merchant & Gould P.C.

(57) ABSTRACT

A universal cable bracket that enables one or more cables to be secured to a telecommunications chassis accommodates cables of various sizes and styles. The cable bracket is configured to be mounted in one of multiple orientations relative to the chassis. One or more fasteners can be inserted through apertures in the bracket and a chassis mounting surface to secure the bracket into the desired orientation. Cables or fanout arrangements can be secured to a platform of the bracket via cable ties or other windings.

21 Claims, 6 Drawing Sheets

(56) References Cited

U.S. PATENT DOCUMENTS

| | | |
|---|---|---|
| 2011/0228473 A1 | 9/2011 | Anderson et al. |
| 2011/0267794 A1 | 11/2011 | Anderson et al. |
| 2012/0113613 A1 | 5/2012 | Anderson et al. |
| 2012/0133524 A1 | 5/2012 | Anderson et al. |

* cited by examiner

ADJUSTABLE SWINGING BRACKET

CROSS-REFERENCE TO RELATED APPLICATIONS

This application is a continuation of application Ser. No. 14/189,376, filed Feb. 25, 2014, now U.S. Pat. No. 9,386,723, which application claims the benefit of provisional application Ser. No. 61/768,871, filed Feb. 25, 2013, and titled "Adjustable Swinging Bracket," which applications are incorporated herein by reference in their entirety.

BACKGROUND

The installation of telecommunications modules in a racking system has previous involved mounting the modules to one or more chassis, which are mounted to a rack. Cables can be routed along the rack (e.g., from overhead troughs or below-ground ducts), to the chassis, and then to the modules. The cables can be secured to the chassis or rack using cable-ties (e.g., zip ties) and/or cable clamps (e.g., having yokes and gaskets). In some cases, the user is supplied with multiple sizes and/or styles of clamps, gaskets, etc. to accommodate cables of various sizes that the user may wish to secure to the chassis or rack. The multitude of parts can be confusing for customers and expensive to manufacture and supply.

Improvements are desired.

SUMMARY

The disclosure relates to a universal cable bracket that enables one or more cables to be secured to a telecommunications chassis (e.g., when the chassis is mounted to a rack, cabinet, or other frame system). The cable bracket is designed to accommodate cables of various sizes and styles (e.g., loose cables, ribbonized cables, fanned-out cables, etc.). In some implementations, the cable bracket is configured to be mounted in one of multiple orientations relative to the chassis to facilitate routing the cables into the chassis while maintaining a bend radius limit.

In accordance with some aspects of the disclosure, the cable bracket is configured to be mounted to the chassis in one of three orientations. For example, the cable bracket can angle the cable relative to the chassis (e.g., at a 45° angle) towards either the top of the chassis or the bottom of the chassis. In certain implementations, the bracket can be pivoted through the various orientations and secured in place using fasteners.

In some implementations, a cable bracket includes a cable mounting section and a chassis mounting section supporting the cable mounting section. The cable mounting section includes a platform defining a plurality of slots extending therethrough. The platform also defines an open-ended cut-out at an intermediate location between at least two of the slots. The chassis mounting section defines a first aperture at a location spaced from the cable mounting section and a second aperture at a location adjacent the cable mounting section. The second aperture defines a pivot path extending along a width of the bracket.

In other implementations, a chassis cable routing system includes a chassis housing; a first cable bracket; and a first plurality of fasteners. The chassis housing defines a first entrance/exit leading to an interior of the chassis housing and a first bracket mounting location adjacent to the entrance/exit. The first bracket mounting location defines a plurality of apertures. The first cable bracket is configured to be coupled to the first bracket mounting location of the chassis housing. The first cable bracket includes a platform configured to hold an optical fiber cable or fanout arrangement. The first cable bracket defines a plurality of apertures that are configured to align with at least some of the apertures of the first bracket mounting location to enable the first cable bracket to be mounted in a selected one of at least two different orientations. The first plurality of fasteners is configured to extend through the apertures in the first cable bracket and through the apertures at the first bracket mounting location to secure the first cable bracket to the chassis housing at the first bracket mounting location.

In other implementations, a method of routing cables to a chassis includes determining a direction along which the cables are to be routed into the chassis through an entrance/exit; mounting a cable bracket to a bracket mounting surface of the chassis adjacent the entrance/exit by inserting a fastener through a first aperture of the cable bracket and through a first aperture defined by the bracket mounting surface to define a pivot axis; orienting the cable bracket relative to the bracket mounting surface into a desired orientation by pivoting the cable bracket about the pivot axis; fixing the cable bracket into the desired orientation by inserting a second fastener through a second aperture of the cable bracket and through a second aperture defined by the bracket mounting surface; and securing the cables to the cable bracket.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

In general, the disclosure relates to a universal cable bracket that enables one or more cables to be secured to a telecommunications chassis. The cable bracket is designed to accommodate cables of various sizes and styles (e.g., loose cables, ribbonized cables, etc.). In certain implementations, fanout arrangements (e.g., MPO fanout arrangements) can be mounted to the cable bracket to transition the cables from a routing form to a connection form. In some implementations, the cable bracket is configured to be mounted in one of at least three orientations relative to the chassis to facilitate routing the cables into the chassis while maintaining a bend radius limit.

Figure 1:
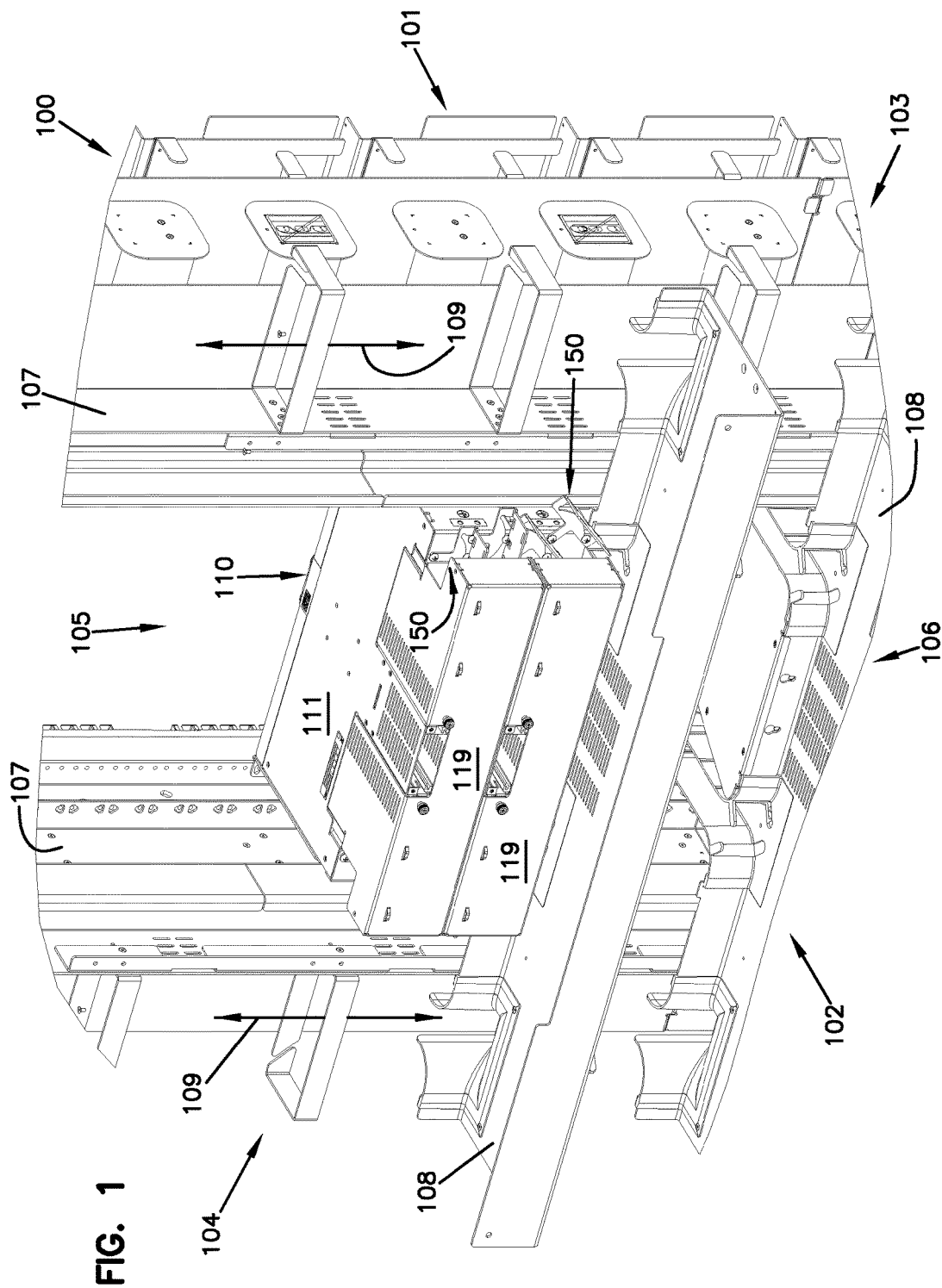
FIG. 1 is a perspective view showing part of a racking system including two chassis mounted to a rack, each chassis including two visible cable brackets.

FIG. 1 illustrates part of an example rack 100 configured to hold one or more chassis 110. The rack 100 has a front 101, a rear 102, a first side 103, a second side 104, a top 105, and a bottom 106. Support members 107 extend between the top 105 and bottom 106 of the rack 100. The chassis 110 can be mounted to the support members 107. The rack 100 is configured to route cables to the chassis 110. For example, the rack 100 provides horizontal troughs, channels, or routing paths 108 and/or vertical troughs, trays, or routing paths 109.

Figure 2:
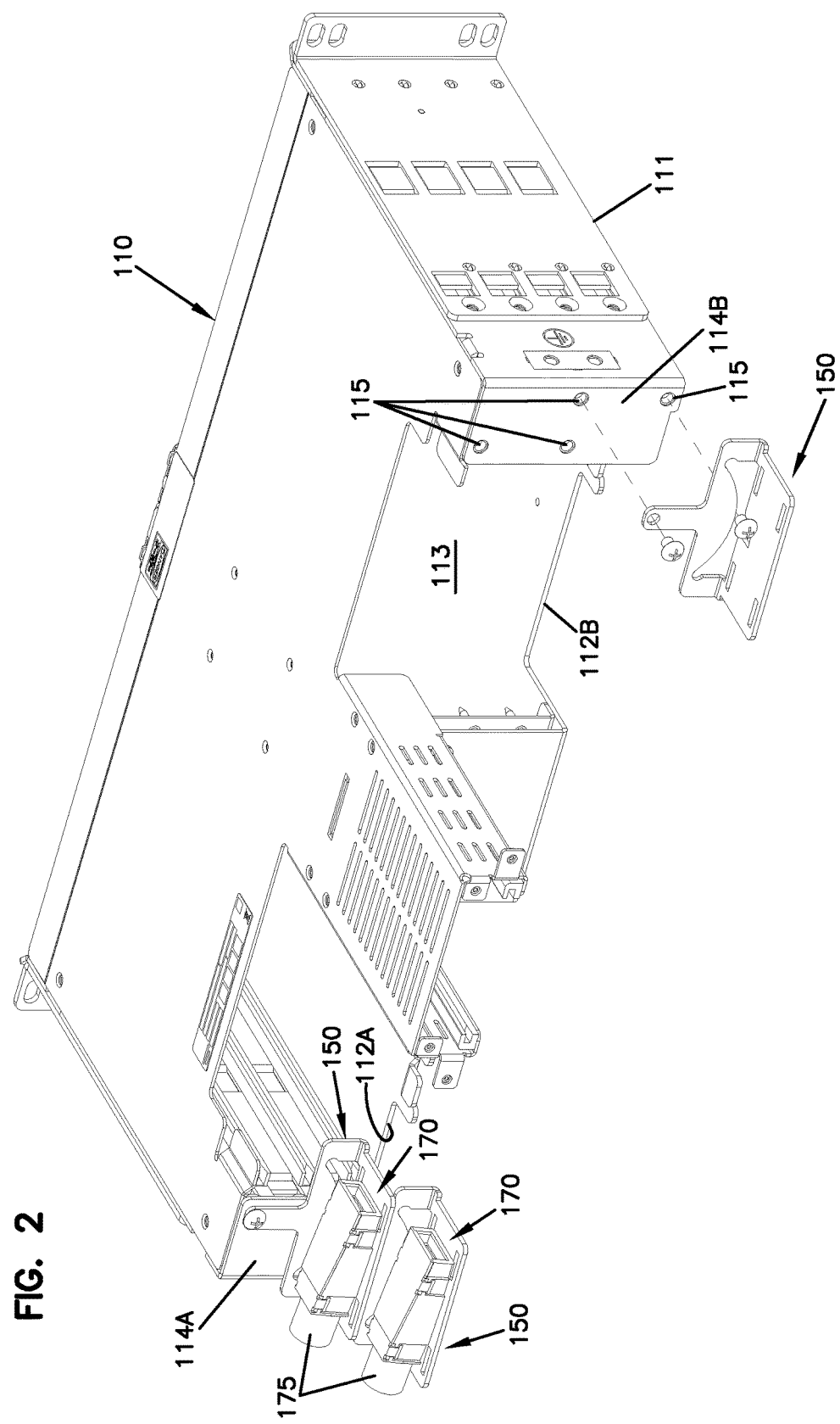
FIG. 2 is a rear perspective view of an example chassis including two cable brackets mounted to one side and one cable bracket exploded from an opposite side.

As shown in FIG. 2, each chassis 110 includes a chassis body 111 that defines an entrance/exit 112 (FIGS. 4-6) that provides access between an interior 113 of the chassis 110 and an exterior of the chassis 110. One or more telecommunications modules (e.g., optical adapters, adapter block assemblies, adapter blades, adapter cassettes, splice trays, storage spools, or other types of optical fiber modules) can be disposed at the chassis 110 and accessible from within the interior 113 of the chassis 110. One or more cables (or optical fibers thereof) can be routed into the chassis interior 113 via the entrance/exit 112 towards the telecommunications modules.

In some implementations, the chassis 110 includes a bracket mounting surface 114 adjacent the entrance/exit 112. The bracket mounting surface 114 defines one or more bracket mounting locations at which a cable bracket 150 can be mounted. For example, the bracket mounting surface 114 can define one or more apertures 115 at which one or more cable brackets 150 can be fastened to the surface 114. In the example shown, each bracket mounting surface 114 defines two bracket mounting locations and each bracket mounting location defines two apertures 115. In other implementations, however, each bracket mounting surface 114 can include a greater or lesser number of bracket mounting locations; and each bracket mounting location can include a greater or lesser number of apertures 115.

In the example shown in FIG. 2, the chassis 110 defines first and second entrances/exits 112A, 112B at a rear of the chassis 110. The first entrance/exit 112A is located towards a first side of the rear of the chassis 110 and the second entrance/exit 112B is located towards a second side of the rear of the chassis 110. A rear cover 119 can be provided over the rear of the chassis 110 to protect the chassis interior 113 and the cables routed thereto. In such implementations, the cable brackets 150 can be secured between the chassis 110 and the rear cover 119. In other implementations, the entrances/exits 112 can be provided at the front of the chassis 110, the top of the chassis, the bottom of the chassis, and/or at one or more sides of the chassis 110.

The chassis 110 shown in FIG. 2 defines a first bracket mounting surface 114A at the first side of the chassis 110 and a second bracket mounting surface 114B at the second side of the chassis 110. The cable brackets 150 mounted to the first bracket mounting surface 114A facilitate routing cables into the chassis interior 113 through the first entrance/exit 112A and the cable brackets 150 mounted to the second bracket mounting surface 114B facilitate routing cables into the chassis interior 113 through the second entrance/exit 112B.

Figure 3:
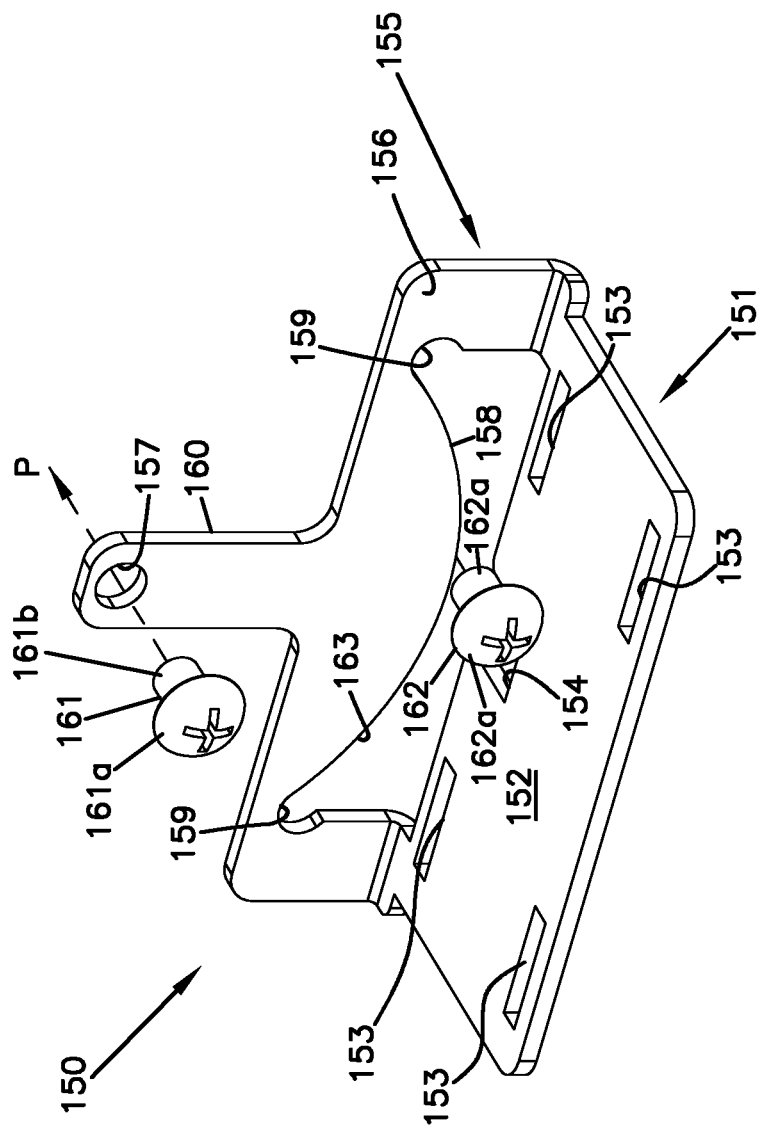
FIG. 3 is a perspective view of an example cable bracket suitable for mounting to the chassis of FIGS. 1 and 2.

FIG. 3 illustrates one example cable bracket 150 suitable for mounting to either of the first and second bracket mounting surfaces 114A, 114B. The cable bracket 150 includes a cable mounting section 151 and a chassis mounting section 155. In certain implementations, the cable mounting section 151 extends generally orthogonally to the chassis mounting section 155. In an example, the cable mounting section 151 and the chassis mounting section 155 are monolithically formed (e.g., of bent sheet metal).

The cable mounting section 151 includes a platform 152 on which one or more cables or fanout arrangements can seat. The platform 152 defines one or more slots 153 through which cable ties, wax lacing, string, yarn, or other windings can be threaded to secure the cables or fanout arrangements to the platform 152. In the example shown, the platform 152 defines four slots 153 that are positioned adjacent the four corners of the platform 152. In other implementations, the platform 152 can define a greater or lesser number of slots 153 (e.g., one, two, six, etc.). The platform 152 also defines an open-ended cutout 154 located adjacent the chassis mounting section 155. In the example shown, the cutout 154 is disposed at an intermediate location between the slots 153.

The chassis mounting section 155 is configured to be mounted to one of the bracket mounting surfaces 114 of the chassis 110. The chassis mounting section 155 includes a plate 156 coupled to and supporting the platform 152. The plate 156 defines at least a first aperture 157 and a second aperture 158. The second aperture 158 is spaced from the first aperture 157. For example, the second aperture 158 may be located closer to the cable mounting section 151 than the first aperture 157. In the example shown, the first aperture 157 is defined through a distal end of a finger 160 extending upwardly from a remainder of the plate 156.

Fasteners (e.g., screws, bolts, rivets, etc.) 161, 162 can be used to secure the cable bracket 150 to the bracket mounting surface 114 of the chassis 110. For example, a first fastener 161 can extend through the first aperture 157 defined by the plate 156 and through one of the apertures 115 at the cable mounting surface 114. A second fastener 162 can extend through the second aperture 158 defined by the plate 156 and through another of the apertures 115 at the cable mounting surface 114. In certain implementations, the open-ended cutout 154 at the cable mounting section 151 facilitates mounting of the second fastener at the second aperture 158 (e.g., see FIG. 3). For example, the cutout 154 may enable a head of the fastener 162 to extend through the platform 152. The cutout 154 may have sufficient depth to enable a full length of the fastener 162 to be disposed within the cutout 154 to facilitate mounting the fastener 162 through the second aperture 158 and the aperture 115 at the bracket mounting surface 114.

Figure 4:
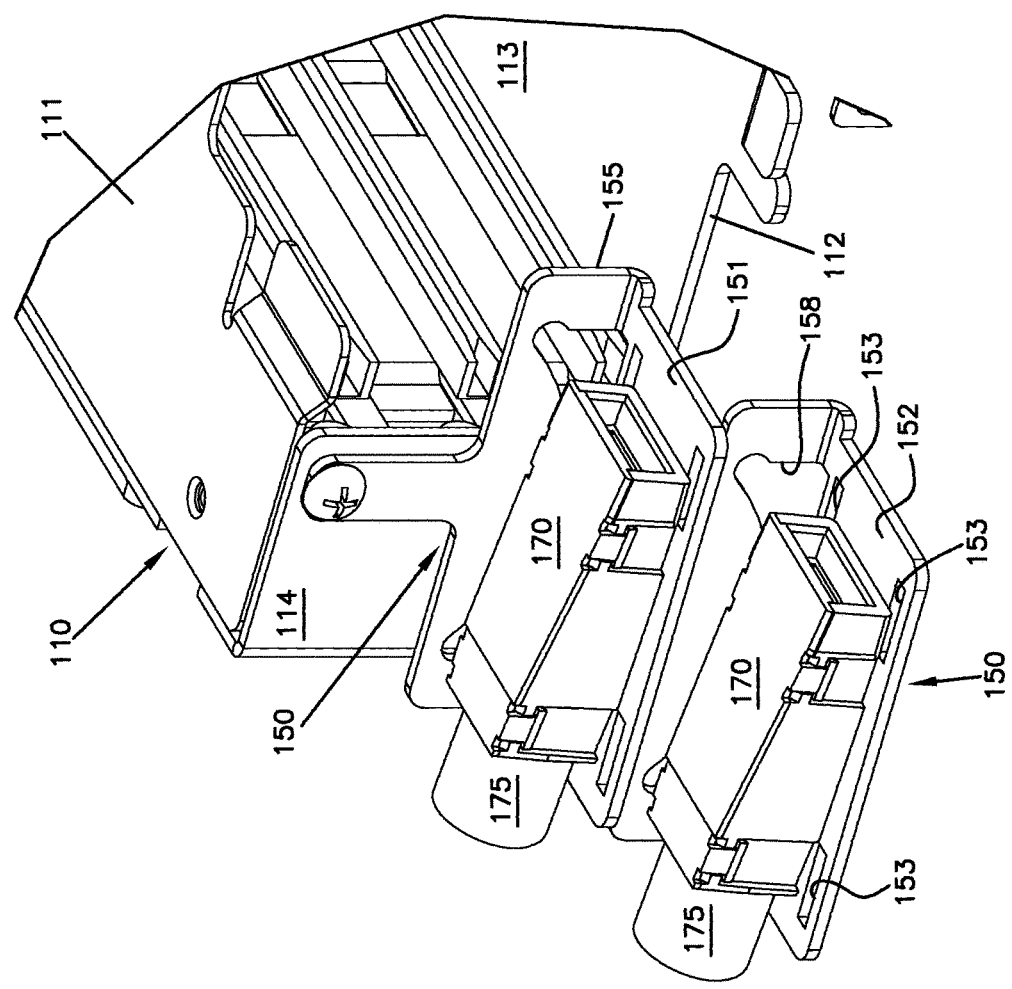
FIG. 4 is an enlarged view of a portion of FIG. 2.
Figure 5:
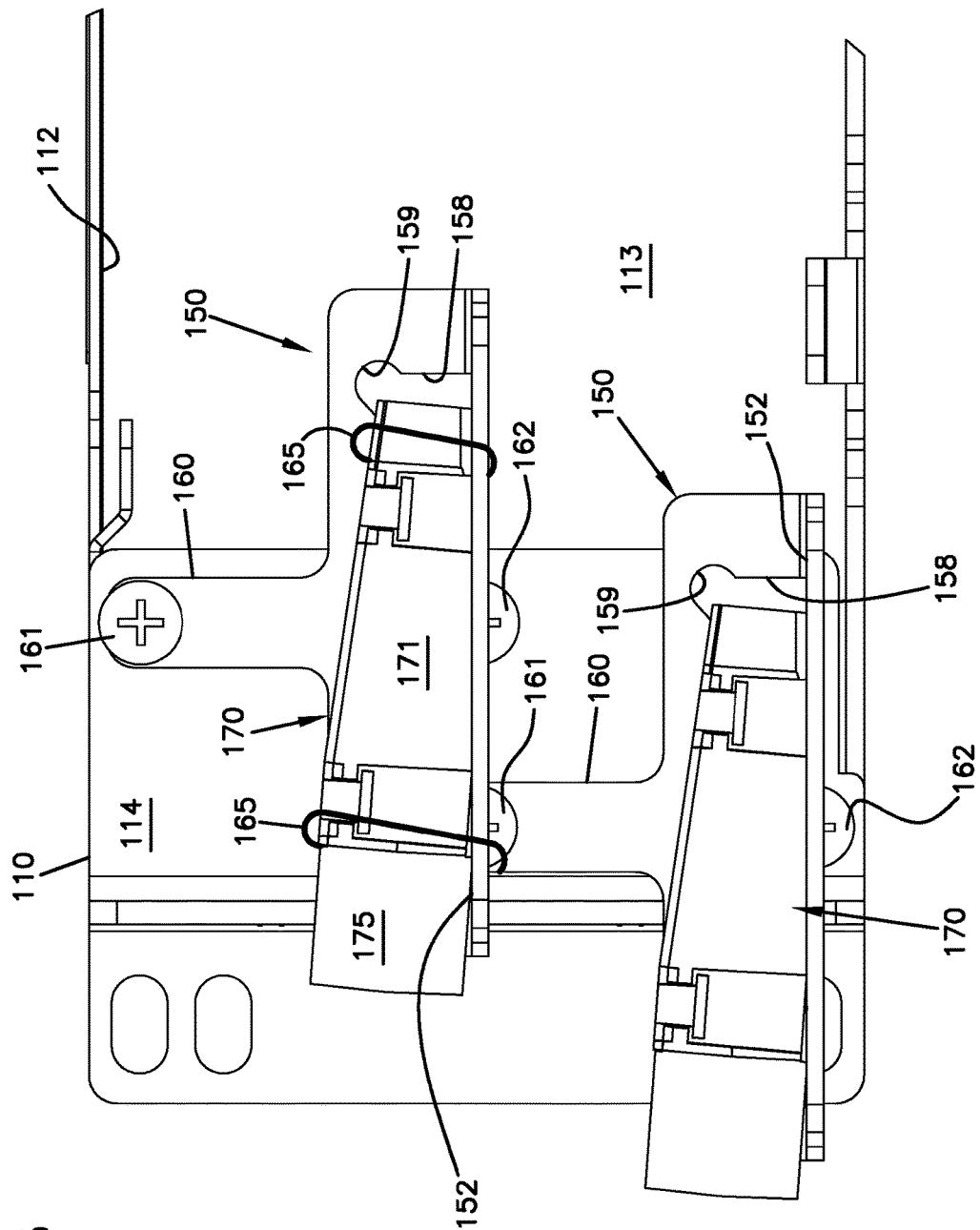
FIG. 5 is a rear elevational view of FIG. 4.

FIGS. 4 and 5 illustrate one example implementation of cable fanout arrangements 170 mounted to cable brackets 150 at a bracket mounting surface 114 of a chassis 110. The fanout arrangements 170 shown are configured to receive optical cables 175 and to separate optical fibers of the cables 175 into individual fibers. In certain implementations, the individual fibers are up-jacketed at the fanout arrangements 170. The fanout arrangements 170 are positioned on the platform 152 of the brackets 150. One or more windings or cable-ties 165 can be wrapped around the fanout arrangement 170 at each bracket 150 to hold the fanout arrangement 170 to the platform 152 (see FIG. 5). In certain implementations, the windings 165 extend through the slots 153 to wrap-around the bottoms of the platforms 152 and extend back upwardly through slots 153 at an opposite end of the platforms 152. In other implementations, the windings 165 can be routed through the second aperture 158.

Referring back to FIG. 3, the cable bracket 150 is configured to pivot a pivot axis P that extends through the first aperture 157. For example, the bracket 150 can be configured to pivot about the first fastener 161 when the first fastener 161 is inserted through the first aperture 157 and one of the apertures 115 at the bracket mounting surface 114. Pivoting the bracket 150 moves the platform 152 between two or more orientations relative to the chassis 110.

In some implementations, the first and second apertures 157, 158 are rounded apertures that are sized larger than an extended portion 161b, 162b of the respective fastener 161, 162, but sized smaller than the head 161a, 162a of the respective fastener 161, 162. In such implementations, the plate 156 of the bracket 150 can define multiple second apertures 158 at which the second fastener 162 can be selectively inserted. In other implementations, the second aperture 158 may be sized so that the second fastener 162 can be inserted through any of a multitude of locations within the second aperture 158.

In certain implementations, the second aperture 158 is shaped to provide a pivot path 163 along which the second fastener 162 can be mounted. The pivot path 163 extends along a width of the cable bracket 150. In certain implementations, the pivot path 163 defines a curved (e.g., concave) surface. The bracket 150 can be locked into one of the orientations by inserting the second fastener 162 through the second aperture 158 at a location along the curved surface of the pivot path 163 and through the aperture 115 at the cable mounting surface 114. In certain implementations, the second aperture 158 defines notches 159 at opposite sides of the second aperture 158 at which the second fastener 162 can be inserted. In certain implementations, notches 159 define the edges of the pivot path 163.

The brackets 150 shown in FIGS. 4 and 5 are mounted to the chassis 150 so that cables 175 are oriented generally horizontally relative to the rack 100 when the cables 175 are bracketed to the chassis 110 and the chassis 110 is mounted to the rack 100. In certain implementations, the major surfaces of the bracket platforms 152 extend generally parallel to top and bottom surfaces of the chassis 110. The first fastener 161 is inserted through the first aperture 157 and the second fastener 162 is inserted through the second aperture 158 at the cutout 154. In some implementations, the second fastener 162 locks the bracket 150 relative to the chassis 110 through a clamping force between the fastener head 162a and the bracket mounting surface 114. In other implementations, the engagement between the second fastener 162 and edges of the platform 152 at the cutout 154 inhibit pivotal movement of the bracket 150 relative to the chassis 110.

Figure 6:
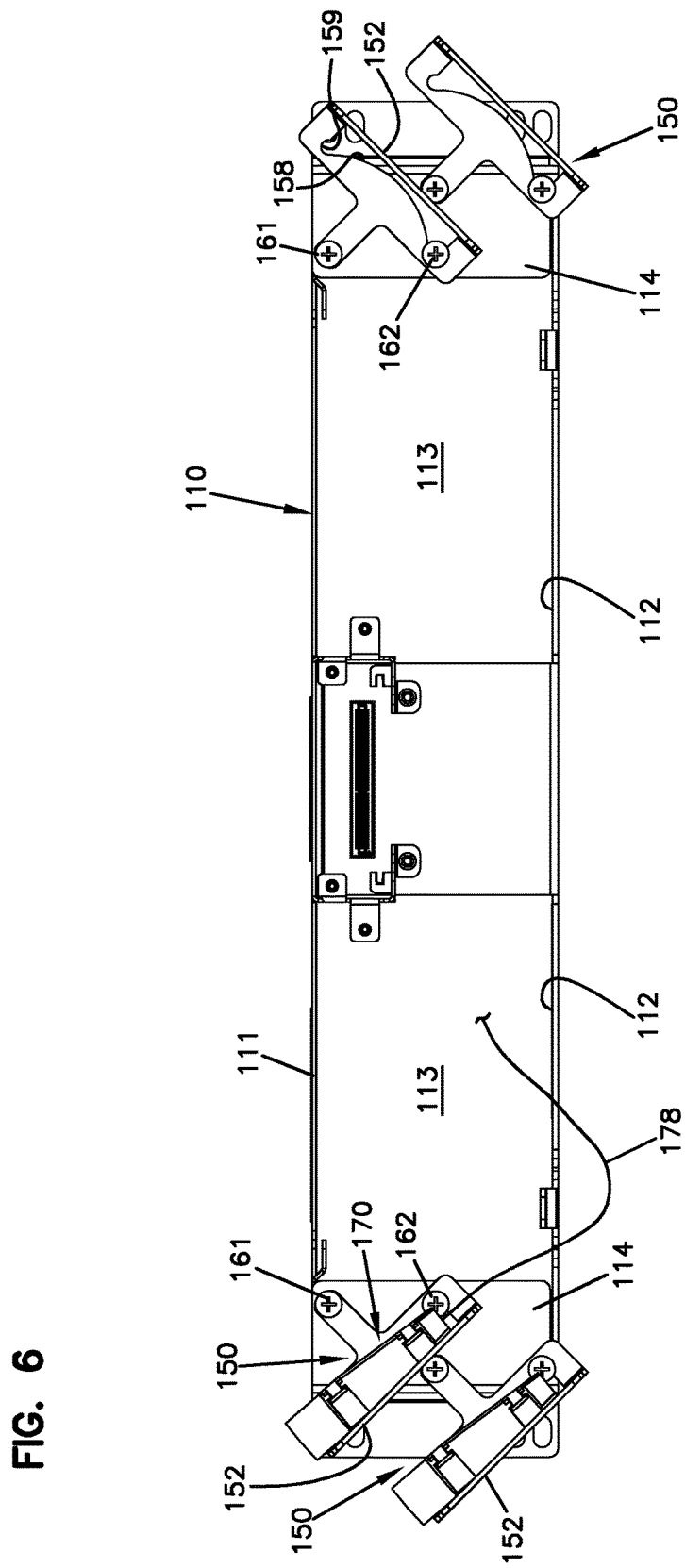
FIG. 6 is a rear elevational view of an example chassis to which four brackets are mounted at angled orientations.

The brackets 150 shown in FIG. 6 are mounted to the chassis 110 at angled orientations. For example, the platforms 152 of the brackets 150 are angled relative to the top or bottom of the chassis 110. In the example shown, the brackets 150 are mounted to direct the cables or fibers 178 secured to the bracket 150 downwardly below the chassis 110 before being routed through the entrance/exits 112. In other implementations, however, the brackets 150 can be mounted to direct the cables upwardly above the chassis 110 before being routed through the entrance/exits 112. In certain implementations, the brackets 150 at one of the bracket mounting surfaces 114 may route the cables in a different direction than the brackets 150 at another of the bracket mounting surfaces 114. In still other implementations, a bracket 150 at one of the bracket mounting surfaces 114 may route the cables in a different direction than another bracket 150 at the same bracket mounting surface 114.

To mount the brackets 150 as shown in FIG. 6, the first fastener 161 is inserted through the first aperture 157 and into one of the apertures 115 at the mounting surface 114. The bracket 150 is pivoted about the first fastener 161 until a desired position relative to the chassis 110 is reached. The second fastener 162 is inserted through the second aperture 158 and into another aperture 115 at the mounting surface 114 to hold the bracket 150 in position. In certain implementations, the bracket 150 is oriented to align the cutout 154 or one of the notches 159 with the other aperture 115. In other implementations, notches 159 can be defined at other locations along the pivot path 163 to facilitate mounting the brackets 150 in other orientations.

In certain implementations, the brackets 150 are oriented at an angle of about 45° relative to the top or bottom of the chassis 110 (i.e., or top 105 or bottom 106 of the rack 100). In the example shown, the second fastener 162 is inserted into the right-most notch 159 of the brackets 150 on the left of the drawing and the second fastener 162 is inserted into the left-most notch 159 of the brackets 150 on the right of the drawing. Each of these brackets 150 is oriented at about a 45° angle. In other implementations, however, the brackets 150 can be positioned to direct the cables at a different angle (e.g., 30°, 40°, 50°, 60°, etc.) relative to the chassis 110.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A cable bracket comprising:
   (a) a cable mounting section including a platform defining a plurality of slots extending therethrough, the platform also defining an open-ended cutout at an intermediate location between at least two of the slots; and
   (b) a chassis mounting section supporting the cable mounting section, the chassis mounting section defining a first aperture at a location spaced from the cable mounting section, the chassis mounting section also defining a second aperture at a location adjacent the cable mounting section, the second aperture defining a pivot path extending along a width of the bracket;
   (c) the cable bracket being symmetrical about an axis extending through both the cable mounting section and the chassis mounting section.

2. The cable bracket of claim 1, wherein the chassis mounting section extends generally orthogonal to the cable mounting section.

3. The cable bracket of claim 1, wherein the chassis mounting section is monolithically formed with the cable mounting section.

4. The cable bracket of claim 1, wherein the chassis mounting section defines notches at opposite ends of the pivot path.

5. The cable bracket of claim 1, wherein the cutout is defined at an intermediate point along the pivot path.

6. The cable bracket of claim 1, wherein the chassis mounting section includes a plate defining the second aperture and a finger extending upwardly from the plate, the finger defining the first aperture.

7. The cable bracket of claim 6, wherein the bracket is symmetrical about an axis extending along the finger.

8. The cable bracket of claim 1, wherein the platform defines four slots.

9. A chassis cable routing system comprising:
a chassis housing defining a first entrance/exit leading to an interior of the chassis housing, the chassis housing defining a first bracket mounting location adjacent to the entrance/exit, the first bracket mounting location defining a plurality of apertures;
a first cable bracket configured to be coupled to the first bracket mounting location of the chassis housing, the first cable bracket including a platform configured to hold an optical fiber cable or fanout arrangement, the first cable bracket defining a plurality of apertures that are configured to align with at least some of the apertures of the first bracket mounting location to enable the first cable bracket to be mounted in a selected one of at least two different orientations; and
a first plurality of fasteners configured to extend through the apertures in the first cable bracket and through the apertures at the first bracket mounting location to secure the first cable bracket to the chassis housing at the first bracket mounting location.

10. The chassis cable routing system of claim 9, wherein the chassis housing defines a second bracket mounting location at an opposite side of the chassis from the first bracket mounting location, the second bracket mounting location being disposed adjacent to a second entrance/exit into an interior of the chassis housing, the second bracket mounting location defining a plurality of apertures.

11. The chassis cable routing system of claim 10, further comprising:
a second cable bracket configured to be coupled to the second bracket mounting location of the chassis housing, the second cable bracket being identical to the first cable bracket; and
a second plurality of fasteners configured to extend through the apertures in the second cable bracket and through the apertures at the second bracket mounting location to secure the second cable bracket to the chassis housing at the second bracket mounting location.

12. The chassis cable routing system of claim 9, wherein one of the apertures of the first cable bracket defines a pivot path extending along a width of the first cable bracket, the pivot path defining a curved surface.

13. The chassis cable routing system of claim 12, wherein the first cable bracket defines notches at opposite ends of the pivot path.

14. The chassis cable routing system of claim 9, wherein the platform defines a plurality of slots via which a cable or fanout arrangement can be coupled to the first cable bracket.

15. A method of routing cables to a chassis, the method comprising:
determining a direction along which the cables are to be routed into the chassis through an entrance/exit;
mounting a cable bracket to a bracket mounting surface of the chassis adjacent the entrance/exit by inserting a fastener through a first aperture of the cable bracket and through a first aperture defined by the bracket mounting surface to define a pivot axis;
orienting the cable bracket relative to the bracket mounting surface into a desired orientation by pivoting the cable bracket about the pivot axis;
fixing the cable bracket into the desired orientation by inserting a second fastener through a second aperture of the cable bracket and through a second aperture defined by the bracket mounting surface; and
securing the cables to the cable bracket.

16. The method of claim 15, wherein the cables are secured to the cable bracket using cable ties or windings.

17. The method of claim 15, wherein pivoting the cable bracket about the pivot axis comprises pivoting the cable bracket until a notched section of the second aperture aligns with the second aperture of the bracket mounting surface.

18. The method of claim 15, wherein the second aperture of the cable bracket defines a pivot path; and wherein at least some portion of the pivot path aligns with the second aperture of the bracket mounting surface as the cable bracket is pivoted about the pivot axis.

19. The method of claim 15, further comprising:
mounting an identical cable bracket to a second bracket mounting surface of the chassis by inserting a third fastener through a first aperture of the identical cable bracket and through a first aperture defined by the second bracket mounting surface to define a second pivot axis, the second bracket mounting surface being spaced from the bracket mounting surface;
orienting the identical cable bracket relative to the second bracket mounting surface into a second desired orientation;
fixing the identical cable bracket into the second desired orientation by inserting a second fastener through a second aperture of the identical cable bracket and through a second aperture defined by the second bracket mounting surface; and
securing additional cables to the identical cable bracket.

20. The method of claim 19, wherein the cable bracket is oriented at an angle towards a first side of the chassis and wherein the identical cable bracket is oriented at an angle towards a second side of the chassis.

21. A cable bracket comprising:
(a) a cable mounting section including a platform defining a plurality of slots extending therethrough, the platform also defining an open-ended cutout at an intermediate location between at least two of the slots; and
(b) a chassis mounting section supporting the cable mounting section, the chassis mounting section defining a first aperture at a location spaced from the cable mounting section, the chassis mounting section also defining a second aperture at a location adjacent the cable mounting section, the second aperture defining a pivot path extending along a width of the bracket, wherein the chassis mounting section includes a plate defining the second aperture and a finger extending upwardly from the plate, the finger defining the first aperture, wherein the bracket is symmetrical about an axis extending along the finger.

* * * * *